United States Patent
Wang et al.

(10) Patent No.: US 8,383,440 B2
(45) Date of Patent: Feb. 26, 2013

(54) LIGHT SHIELD FOR CMOS IMAGER

(75) Inventors: Wen-De Wang, Minsyong Township (TW); Dun-Nian Yaung, Taipei (TW); Shou-Gwo Wuu, Hsin-Chu (TW); Chung-Yi Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 145 days.

(21) Appl. No.: 13/081,120

(22) Filed: Apr. 6, 2011

(65) Prior Publication Data

US 2011/0183460 A1   Jul. 28, 2011

Related U.S. Application Data

(62) Division of application No. 11/066,432, filed on Feb. 24, 2005, now Pat. No. 7,935,994.

(51) Int. Cl.
*H01L 21/00* (2006.01)

(52) U.S. Cl. .............. 438/48; 438/73; 257/E31.085

(58) Field of Classification Search .......... 438/48, 438/73; 257/E31.085
See application file for complete search history.

(56) References Cited

U.S. PATENT DOCUMENTS

| | | | |
|---|---|---|---|
| 5,525,813 A | 6/1996 | Miyake et al. |
| 6,071,826 A | 6/2000 | Cho et al. |
| 6,169,317 B1 | 1/2001 | Sawada et al. |
| 6,180,969 B1 | 1/2001 | Yang et al. |
| 6,229,165 B1 | 5/2001 | Sakai et al. |
| 6,229,191 B1 | 5/2001 | Cao et al. |
| 6,255,640 B1 | 7/2001 | Endo et al. |
| 6,326,652 B1 | 12/2001 | Rhodes |
| 6,350,127 B1 | 2/2002 | Chiang et al. |
| 6,514,785 B1 | 2/2003 | Chiang et al. |
| 6,730,899 B1 | 5/2004 | Stevens et al. |
| 6,791,130 B2 | 9/2004 | Chao et al. |
| 6,927,432 B2 | 8/2005 | Holm et al. |
| 2001/0042875 A1 | 11/2001 | Yoshida |
| 2002/0051071 A1 | 5/2002 | Itano et al. |
| 2002/0195712 A1 | 12/2002 | Nohsoh et al. |
| 2003/0127647 A1 | 7/2003 | Street et al. |
| 2004/0109068 A1 | 6/2004 | Mitsunaga et al. |
| 2004/0132262 A1 | 7/2004 | Ayabe et al. |
| 2004/0147068 A1 | 7/2004 | Toyoda et al. |
| 2004/0222481 A1 | 11/2004 | Rhodes |
| 2004/0235215 A1 | 11/2004 | Komori |
| 2005/0045927 A1 | 3/2005 | Li |

(Continued)

FOREIGN PATENT DOCUMENTS

| | | |
|---|---|---|
| JP | 03-183166 | 8/1991 |
| JP | 2001-267544 | 9/2001 |
| JP | 2003-282850 | 10/2003 |
| JP | 2004-221578 | 8/2004 |
| JP | 2005-333131 | 12/2005 |

OTHER PUBLICATIONS

Wuu, S-G., et al., "High Performance 0.25-um CMOS Color Imager Technology with Non-silicide Source/Drain Pixel," IEDM (2000) pp. 705-708.

(Continued)

*Primary Examiner* — Bradley K Smith
*Assistant Examiner* — Timor Karimy
(74) *Attorney, Agent, or Firm* — Slater & Matsil, L.L.P.

(57) ABSTRACT

System and method for providing a light shield for a CMOS imager is provided. The light shield comprises a structure formed above a point between a photo-sensitive element and adjacent circuitry. The structure is formed of a light-blocking material, such as a metal, metal alloy, metal compound, or the like, formed in dielectric layers over the photo-sensitive elements.

20 Claims, 3 Drawing Sheets

U.S. PATENT DOCUMENTS

| | | |
|---|---|---|
| 2005/0045928 A1 | 3/2005 | Kuriyama |
| 2005/0087784 A1 | 4/2005 | Lee et al. |
| 2005/0106885 A1 | 5/2005 | Albertson et al. |
| 2005/0151175 A1 | 7/2005 | Ohkawa |
| 2005/0205955 A1 | 9/2005 | Shim |
| 2005/0253212 A1 | 11/2005 | Nam et al. |

OTHER PUBLICATIONS

Rhodes, H., et al., "CMOS Imager Technology Shrinks and Image Performance," IEEE (2004) pp. 7-18.

Fossum, E.R., "CMOS Image Sensors: Electronic Camera-On-A-Chip," IEEE Transactions on Electron Devices, vol. 44, No. 10 (Oct. 1997) pp. 1689-1698.

LIGHT SHIELD FOR CMOS IMAGER

This application is a divisional of U.S. patent application Ser. No. 11/066,432, filed on Feb. 24, 2005, entitled "Light Shield for CMOS Imager," which application is hereby incorporated herein by reference in its entirety.

TECHNICAL FIELD

The present invention relates generally to image sensors, and more particularly, to CMOS image sensors having a light shield comprising electrical conductive material.

BACKGROUND

Complementary metal-oxide semiconductor (CMOS) image sensors are gaining in popularity over traditional charged-coupled devices (CCDs) due to certain advantages inherent in the CMOS image sensors. In particular, CMOS image sensors typically require lower voltages, consume less power, enable random access to image data, may be fabricated with compatible CMOS processes, and enable integrated single-chip cameras.

Generally, CMOS image sensors utilize light-sensitive CMOS circuitry to convert light energy into electrical energy. The light-sensitive CMOS circuitry typically comprises a photo-diode formed in a silicon substrate. As the photo-diode is exposed to light, an electrical charge is induced in the photo-diode. The photo-diode is typically coupled to a MOS switching transistor, which is used to sample the charge of the photo-diode. Colors may be determined by placing filters over the light-sensitive CMOS circuitry.

A CMOS image sensor typically comprises an array of CMOS image pixels, each of which may include transistors (switching transistor and reset transistor), capacitors, and a photo-sensitive element (e.g., a photo-diode). Each pixel may also include a color filter to determine a color of light received by the photo-sensitive element. An aperture is generally formed over the photo-sensitive element to expose the photo-sensitive element while blocking the light from the other circuitry.

The performance, sensitivity, and resolution of the CMOS image sensors, however, may be degraded due to crosstalk caused by light being received at oblique angles to the aperture generating an electrical current in other parts of the circuitry. As a result, the magnitude of the light being received may be falsely magnified, possibly resulting in a "washed out" or blurred image. Additionally, light being received at oblique angles to the aperture may also generate a current in adjacent pixels. In the case in which color filters are being used, the current being received by an adjacent pixel may have the detrimental effect of falsely indicating the colors being received by each pixel.

Accordingly, there is a need for an image sensor having a light shield that prevents or reduces crosstalk.

SUMMARY OF THE INVENTION

These and other problems are generally solved or circumvented, and technical advantages are generally achieved, by preferred embodiments of the present invention which provides an apparatus, and a method of manufacture, having an inter-metal dielectric that prevents or reduces film delamination and contact corrosion defects.

In accordance with an embodiment of the present invention, a CMOS image sensor is provided. The CMOS image sensor comprises a photo-sensitive element in a substrate; one or more dielectric layers formed over the substrate; and an electrically conductive material formed in a plurality of the dielectric layers, the electrically conductive material being positioned over a point between the photo-sensitive element and adjacent circuitry, the electrically conductive material comprising at least a single plug formed through the plurality of dielectric layers.

In accordance with another embodiment of the present invention, a method for forming a CMOS image sensor is provided. The method comprises forming a photo-sensitive element on a substrate; forming a plurality of dielectric layers over the substrate; forming an opening in the plurality of the dielectric layers, the opening being positioned above a point between the photo-sensitive element and adjacent circuitry; and filling the opening with an electrically conductive material.

In accordance with still another embodiment of the present invention, a CMOS image sensor is provided, the CMOS image sensor comprises a photodiode and a pinned layer in a substrate; one or more dielectric layers formed over the substrate; and a light shield comprising metal formed in a plurality of the dielectric layers, the light shield being positioned over a point between the photodiode and adjacent MOS circuitry, the light shield comprising a single plug formed through the plurality of dielectric layers, the MOS circuitry comprising switching transistor and reset transistor.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
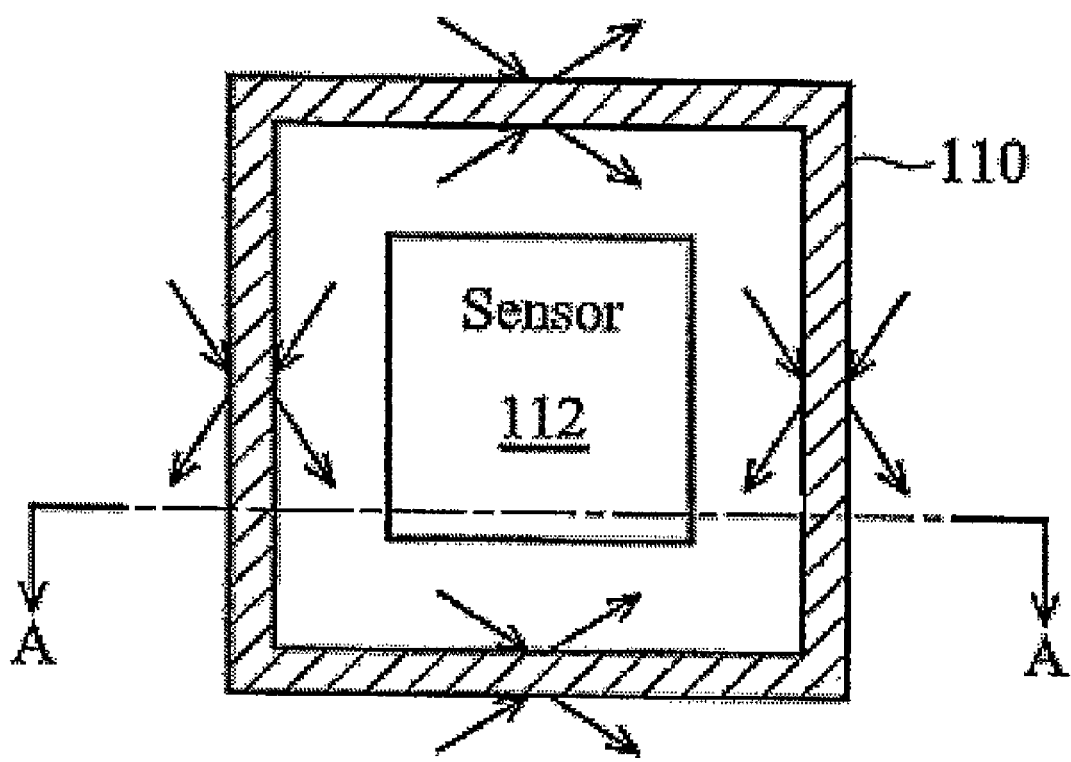
FIG. 1 is a plan view of a photo-sensitive element having a light shield in accordance with an embodiment of the present invention.

Referring first to FIG. 1, a plan view of a light shield 110 positioned around a photo-sensitive element 112 in accordance with an embodiment of the present invention is shown. It should be noted that the light shield 110 is illustrated having a square shape for illustrative purposes only. The light shield 110 may have any shape that substantially protects adjacent photo-sensitive elements (not shown) and/or other circuitry (not shown) from crosstalk. For example, the shape of the light shield 110 may be elliptical, circular, rectangular, octagonal, or the like. Furthermore, the light shield 110 may not completely surround the photo-sensitive element 112, and therefore, the light shield 110 may be discontinuous around the photo-sensitive element 112.

The photo-sensitive element 112 may be any element that generates an electrical current upon being exposed to light energy. For example, the photo-sensitive element 112 may be formed by implanting impurities via an ion implant in a substrate to form, for example, a PN junction photo-diode, a PNP photo-diode, an NPN photo-diode, or the like. A preferred embodiment of the present invention utilizes a PNP photo-diode, e.g., the photo-sensitive element 112 may comprise a P-type pinned layer formed on an N-type region, wherein the N-type region is formed on a P-type semiconductor substrate.

As illustrated by the directional arrows in FIG. 1, light originating from outside the light shield 110 is reflected, thereby preventing or reducing the effect of the light originating from outside the light shield 110 on the photo-sensitive element 112. This particular scenario is particularly advantageous with light arriving at an oblique angle to the surface by preventing the photo-sensitive element 112 from being affected by light from adjacent cells. Furthermore, light to be detected by the photo-sensitive element 110 is prevented from affecting adjacent cells.

As will be discussed in greater detail below, the light shield 110 is positioned in one or more of the metal layers overlying the photo-sensitive element 112, which is typically formed in a substrate. In one embodiment, the light shield 110 comprises a via formed through one or more inter-metal dielectric layers. In another embodiment, the light shield 110 may comprise metal lines interconnected by vias. In both embodiments, it is preferred that the light shield 110 be formed of a metal, metal alloy, metal compound, or the like. It has been found that these materials have a relatively high reflection index that prevents or reduces the amount of light that may pass through the light shield to adjacent photo-sensitive elements and/or circuitry. Using these materials also allows the light shield 110 to be fabricated during normal processing steps with few or no additional processing steps. Rather, the light shield 110 may be formed by modifying the masks and patterns used in the normal process.

It should be noted that in a preferred embodiment, the photo-sensitive element 112 shown in FIG. 1 includes only the element (e.g., the photo-diode). Other circuitry 211 (such as switching transistors, reset transistors, MOS circuitry, optical sensing elements, adjacent electrical elements, etc.) is preferably positioned outside the light shield 110 to prevent the other circuitry from being exposed and affected by light. Other circuitry, however, may be located within the light shield.

Figure 2:
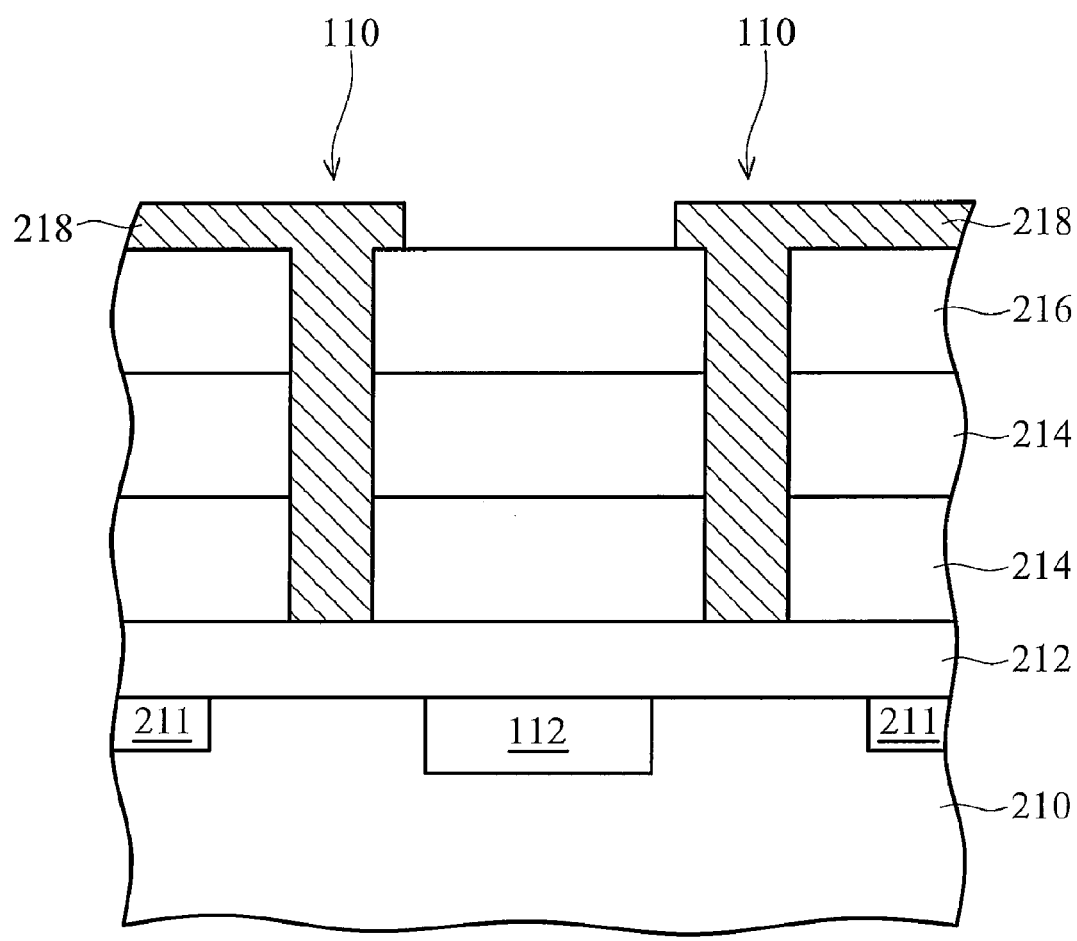
FIG. 2 is a cross-section view of a light shield in accordance with a first embodiment of the present invention.

FIG. 2 is a cross-section view of a first embodiment of a light shield in accordance with an embodiment of the present invention, wherein the cross-section view is taken along the A-A line shown in FIG. 1. As shown in FIG. 2, the photo-sensitive element 112 is formed in a substrate 210. The substrate 210 may be formed of silicon, germanium, silicon germanium, graded silicon germanium, semiconductor-on-insulator, carbon, quartz, sapphire, glass, or the like, and may be multi-layered (e.g., strained layers). In embodiments in which the photo-sensitive element 112 is a PNP photo-diode, the substrate 210 may be a P-type substrate (or containing a P-well).

An interlayer dielectric (ILD) layer 212 is formed over the substrate 210. The ILD layer 212 may be formed, for example, of a low-K dielectric material, such as silicon dioxide, phosphosilicate glass (PSG), borophosphosilicate glass (BPSG), fluorinated silicate glass (FSG), or the like, by any suitable method known in the art. In an embodiment, the ILD layer 212 comprises an oxide that may be formed by chemical vapor deposition (CVD) techniques using tetra-ethyl-ortho-silicate (TEOS) and oxygen as a precursor. The ILD layer 212 is preferably about 2500 Å to about 10000 in thickness. Other thicknesses and materials may be used.

One or more inter-metal dielectric (IMD) layers 214 may be formed over the ILD layer 212. The IMD layers 214 may be formed, for example, of a low-K dielectric material, such as fluorinated silicate glass (FSG), carbon-doped fluorinated silicate glass, carbon-doped silicon oxide (e.g., Black Diamond™ manufactured by Applied Materials of Santa Clara, Calif.) or the like, by any suitable method known in the art. Generally, the IMD layers 214 allow one or more layers upon which conductive lines (not shown) may be formed to allow connectivity between various electronic components. In a preferred embodiment, the IMD layers 214 may be formed of a high-density plasma (HDP) oxide or a plasma-enhanced (PE) oxide formed by conventional methods. Other types of dielectric materials, however, may be used. The IMD layers 214 are preferably about 2000 Å to about 8000 Å in thickness.

A passivation layer 216 may be formed over the IMD layers 214. The passivation layer 216 is formed over and protects the upper-most metal layer. (The metal lines are not shown in FIG. 2.) The passivation layer 216 may be formed of a dielectric material in a manner similar to the IMD layers 214, e.g., HDP oxide, PE oxide, PE nitride or combinations thereof, formed by conventional methods. The passivation layer 216 is preferably about 2000 Å to about 10,000 in thickness Thereafter, the light shield 110 may be formed. The light shield 110 preferably comprises a continuous barrier formed through one or more of the passivation layers 216 and the IMD layers 214 and is preferably formed of a material having good reflective properties. In the embodiment illustrated in FIG. 2, an opening may be formed in the passivation layer 216 and the IMD layers 214 by a dry-etch process wherein the depth is controlled by timing the etch process. Preferably, the opening has a width of about 0.1 µm to about 0.5 µm, but more preferably about 0.2 µm. In an alternative embodiment, an opening in the passivation layer 216, the IMD layers 214 and the ILD layer 212 may be formed by a dry-etch process wherein the ILD layer 212 is partially or completely removed.

It should be noted that an etch stop layer may or may not be located between the ILD layer 212, the IMD layers 214, and the passivation layer 216. In a preferred embodiment, there is no etch stop layer formed between these layers. In this embodiment, the opening may be etched in a single step. If an etch stop layer is utilized, however, the etching process may comprise multiple etching steps to etch through the dielectric layers and the etch stop layers.

Once formed, the opening may be filled with an electrical conductive material or light-barrier material 218. The light-barrier material 218 is preferably a metal, metal alloy, metal compound, or the like, due to its reflective properties. Preferably width of the electrical conductive material is about 0.1 µm an to about 0.5 µm an and height of the electrical conductive material is more than 0.3 µm. In an embodiment, the opening is filled with TiN using a chemical-vapor deposition (CVD) process. Other materials, such as W, refractory metal or combinations thereof, may also be used.

It should be noted that excess materials deposited along the surface may be removed by a process such as Chemical Mechanical Polishing (CMP) or plasma etch back. For example, the light-barrier material 218 that may be deposited above the photo-sensitive element 112 should be removed to allow light to reach the photo-sensitive element 112. It should be noted that the light-barrier material 218 may remain along the surface of the passivation layer 216 in areas not positioned above the photo-sensitive element 112, thereby reducing or preventing the light from adversely affecting other circuitry around the photo-sensitive element 112.

Figure 3:
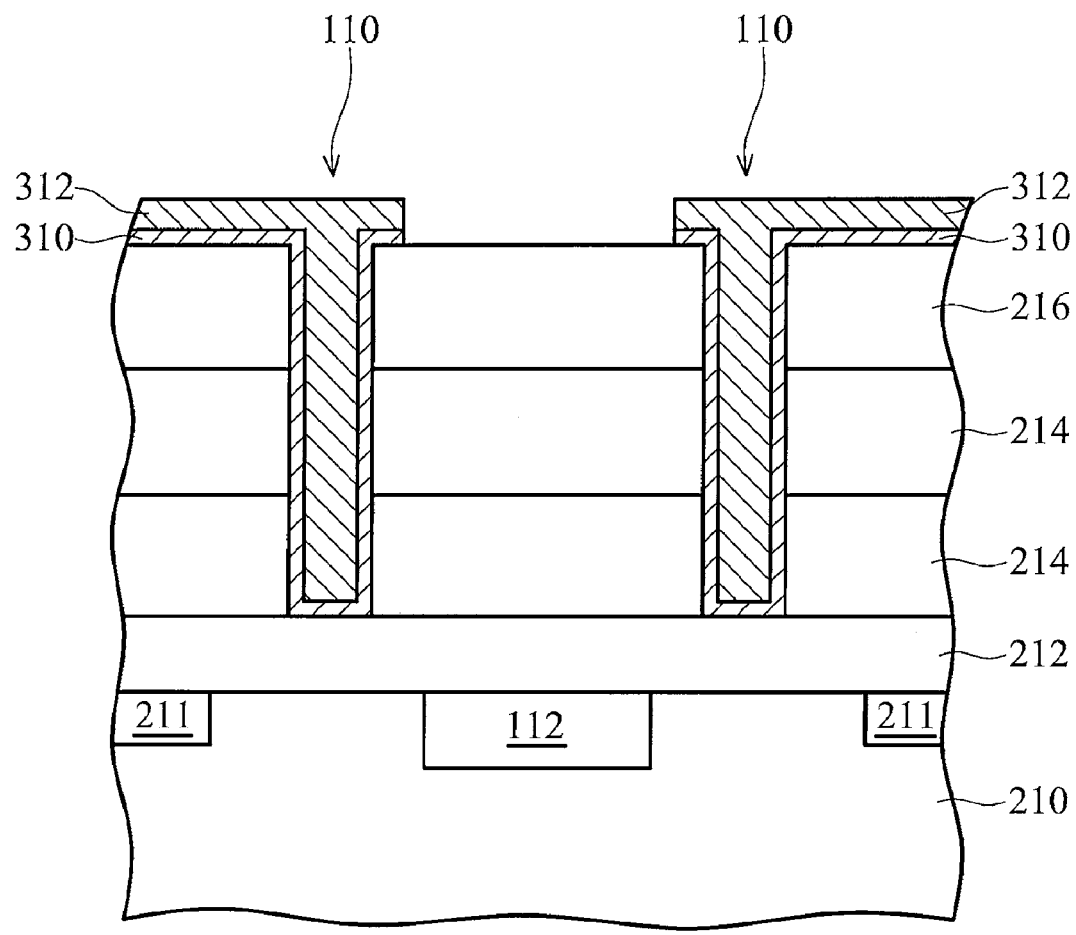
FIG. 3 is a cross-section view of a light shield in accordance with a second embodiment of the present invention.

FIG. 3 is a cross-section view of a second embodiment of a light shield in accordance with an embodiment of the present invention, wherein the cross-section view is taken along the A-A line shown in FIG. 1. This embodiment is similar to the embodiment illustrated in FIG. 2, wherein like reference numerals refer to like elements, except that the light shield 110 comprises a multi-layer structure. In particular, the light shield 110 in FIG. 3 comprises a first layer 310 and a second layer 312. In some processes, this type of structure may be more consistent and compatible with processing steps already performed to create the CMOS image sensor. For example, it is common for vias and interconnects to be formed of a conductive layer (e.g., the second layer 312) overlying a barrier/adhesion layer (e.g., the first layer 310). By using common processes and structures, it may be possible to form the light shield 110 while adding few or no additional process steps.

In an embodiment, the first layer 310 may be formed of one or more layers of titanium, titanium nitride, tantalum, tantalum nitride, or the like, deposited by CVD techniques to a combined thickness of about 100 Å to about 1000 Å. The second layer 312 may be formed of an opaque or reflective material, such as a metal, metal alloy, metal compound, or the like, such as tungsten or aluminum. In an exemplary embodiment in which the second layer 312 is formed of tungsten, the second layer 312 may be deposited by CVD or sputter techniques known in the art.

An etch process or processes may be used to remove excess materials of the first layer 310 and the second layer 312 from the surface of the passivation layer 216 as described above with reference to FIG. 2.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a CMOS image sensor, the method comprising:
   forming a photo-sensitive element and circuitry on a substrate, the circuitry being adjacent to the photo-sensitive element;
   forming a plurality of dielectric layers over the substrate, the plurality of dielectric layers being directly over the photo-sensitive element;
   forming an opening in the plurality of the dielectric layers, the opening being positioned above a point between the photo-sensitive element and a lateral edge of the circuitry nearest to the photo-sensitive element; and
   filling the opening with an electrically conductive material, the conductive material being electrically isolated from the circuitry.

2. The method of claim 1, wherein the electrically conductive material comprises a metal, a metal alloy, or a metal compound.

3. The method of claim 1, further comprising forming a liner in the opening prior to the filling the opening with the electrically conductive material.

4. The method of claim 3, wherein the liner comprises titanium nitride and the electrically conductive material comprises tungsten.

5. The method of claim 1, wherein the electrically conductive material comprises titanium nitride.

6. The method of claim 1, wherein the forming the opening includes forming the opening substantially around the photo-sensitive element.

7. The method of claim 1, wherein a width of the opening is about 0.1 µm an to about 0.5 µm.

8. The method of claim 1, wherein a height of the opening is more than 0.3 µm.

9. The method of claim 1, wherein the opening is formed around the photo-sensitive element.

10. A method comprising:
    forming a photo-sensitive element in a substrate, the substrate having circuitry therein, the photo-sensitive element being proximate the circuitry;
    forming a first dielectric layer and a second dielectric layer on the substrate and over the photo-sensitive element;
    etching a continuous via through the first dielectric layer and the second dielectric layer, the continuous via being above an area between the photo-sensitive element and a lateral edge of the circuitry, the lateral edge being nearest the photo-sensitive element; and
    filling the continuous via with a light barrier material.

11. The method of claim 10, wherein the light barrier material comprises a metal, a metal alloy, a metal compound, or a combination thereof.

12. The method of claim 10, wherein the photo-sensitive element comprises a photo-diode.

13. The method of claim 10, wherein the circuitry comprises an optical sensing element or a switching MOSFET transistor.

14. The method of claim 10 further comprising forming a barrier layer in the continuous via immediately adjacent the first dielectric layer and the second dielectric layer.

15. A method comprising:
    forming a photo-sensitive element in a substrate;
    forming a light shield comprising a reflective material through a plurality of dielectric layers over the substrate and the photo-sensitive element, the forming the light shield comprising:
      etching an opening through the plurality of dielectric layers, the opening being above an area intermediate the photo-sensitive element and a lateral edge of an electrical element adjacent the photo-sensitive element, the lateral edge being a nearest edge of the electrical element to the photo-sensitive element; and
      forming the reflective material in the opening.

16. The method of claim 15, wherein the reflective material comprises a metal, a metal alloy, a metal compound, or a combination thereof.

17. The method of claim 15, wherein the opening is etched around the photo-sensitive element.

18. The method of claim 15, wherein the forming the light shield further comprises forming an adhesion layer in the opening and immediately adjoining the plurality of dielectric layers.

19. The method of claim 15, wherein the reflective material is isolated from the electrical element.

20. The method of claim 15, wherein an additional dielectric layer is formed intermediate the plurality of dielectric layers and the substrate.

* * * * *